US009923104B2

(12) United States Patent
Jeong et al.

(10) Patent No.: US 9,923,104 B2
(45) Date of Patent: Mar. 20, 2018

(54) PHOTOSENSOR INCLUDING MULTIPLE DETECTION MODE AND METHOD OF OPERATING THE SAME

(71) Applicant: SAMSUNG ELECTRONICS CO., LTD., Suwon-si (KR)

(72) Inventors: Heejeong Jeong, Suwon-si (KR); Jisoo Kyoung, Seoul (KR); Changwon Lee, Hwaseong-si (KR); Jinseong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 181 days.

(21) Appl. No.: 14/701,766

(22) Filed: May 1, 2015

(65) Prior Publication Data

US 2016/0043242 A1    Feb. 11, 2016

(30) Foreign Application Priority Data

Aug. 6, 2014    (KR) .................. 10-2014-0101103

(51) Int. Cl.

| H01L 31/0224 | (2006.01) |
|---|---|
| H01L 31/109 | (2006.01) |
| H01L 31/028 | (2006.01) |
| H01L 31/036 | (2006.01) |

(52) U.S. Cl.

CPC ........ H01L 31/0224 (2013.01); H01L 31/028 (2013.01); H01L 31/036 (2013.01); H01L 31/109 (2013.01); Y02E 10/547 (2013.01)

(58) Field of Classification Search

CPC ............... H01L 31/0224; H01L 31/109; H01L 31/0272; H01L 31/028

USPC ................ 250/208.2, 214.1; 257/252, 253
See application file for complete search history.

(56) References Cited

U.S. PATENT DOCUMENTS

| 8,461,571 | B2 | 6/2013 | Colli |  |
|---|---|---|---|---|
| 8,492,728 | B2 | 7/2013 | Antonuk |  |
| 8,878,120 | B2* | 11/2014 | Patil | B82Y 30/00 |
|  |  |  |  | 250/214.1 |
| 9,453,811 | B2* | 9/2016 | Duesberg | G01N 27/129 |

(Continued)

FOREIGN PATENT DOCUMENTS

| KR | 10-1036453 B1 | 5/2011 |
|---|---|---|
| KR | 10-2011-0057989 A | 6/2011 |
| KR | 10-2011-0064097 A | 6/2011 |

OTHER PUBLICATIONS

Xu, et al., "Photo-Thermoelectric Effect at a Graphene Interface Junction", arXiv:0907.3173v1 [cond-mat.mes-hall] Jul. 18, 2009, pp. 1-5.

(Continued)

Primary Examiner — Seung C Sohn
(74) Attorney, Agent, or Firm — Sughrue Mion, PLLC

(57) ABSTRACT

Provided are a photosensor and a method of operating the same. The photosensor includes a lower electrode, a semiconductor layer, a 2-dimensional material layer, and an upper electrode. Photocurrent generated due to externally radiated light may be operated in a multiple detection mode including a lateral detection mode and a vertical detection mode. The upper electrode may include a plurality of electrode elements, which may be formed of the same conductive material or different conductive materials.

11 Claims, 6 Drawing Sheets

(56) References Cited

U.S. PATENT DOCUMENTS

2012/0205518 A1     8/2012   Voutilainen et al.
2012/0327032 A1*   12/2012   Jeon ................. H01L 27/14609
                                                                                     345/175

OTHER PUBLICATIONS

Hideo Hosono, "Ionic amorphous oxide semiconductors: Material design, carrier transport, and device application", Journal of Non-Crystalline Solids, 352, 2006, pp. 851-858.
Liu, et al., "Plasmon resonance enhanced multicolour photodetection by graphene", Nature Communications, Published Dec. 6, 2011, pp. 1-7.

* cited by examiner

PHOTOSENSOR INCLUDING MULTIPLE DETECTION MODE AND METHOD OF OPERATING THE SAME

RELATED APPLICATION

This application claims the benefit of Korean Patent Application No. 10-2014-0101103, filed on Aug. 6, 2014, in the Korean Intellectual Property Office, the disclosure of which is incorporated herein in its entirety by reference.

BACKGROUND

1. Field

The present disclosure relates to a photosensor, and more particularly, to a photosensor having a multiple detection mode and a method of operating the same.

2. Description of the Related Art

A photosensor is a semiconductor device configured to convert an optical signal into an electrical signal. A photosensor is embodied by a photodiode (PD) or transistor including a multilayered semiconductor thin layer in which a doping region is formed in a silicon substrate by using an ion implantation process. To increase the integration density of the photosensor, a method of increasing the number of unit cells without increasing a chip size may be considered. To this end, the size of a PD may be reduced, but as the size of the PD is gradually reduced, the area of a light-receiving unit configured to receive light may be reduced and image quality may be adversely affected.

After graphene was developed, a vast amount of research has been conducted to develop efficient ultrahigh-speed broadband integrated devices using graphene. Although various methods have been tried in an attempt to embody ultrahigh-speed broadband integrated devices using graphene, when responsivity is increased in a specific wavelength range, the advantages of ultrahigh speed and broadband may be reduced.

SUMMARY

Provided is a photosensor having a double channel structure and a method of manufacturing a photosensor having a double channel structure.

Additional aspects will be set forth in part in the description which follows and, in part, will be apparent from the description, or may be understood by practicing the exemplary embodiments.

According to an aspect of an exemplary embodiment, a photosensor includes a lower electrode, a semiconductor layer formed on the lower electrode, a 2-dimensional material layer formed on the semiconductor layer, and an upper electrode that contacts the 2-dimensional material layer.

The upper electrode may include a plurality of electrode elements.

The upper electrode may include at least two electrode elements, each of which is in contact with the 2-dimensional material layer.

The electrode elements may be formed apart from one another on the 2-dimensional material layer.

The upper electrode may include a first upper electrode and a second upper electrode, each of which is in contact with the 2-dimensional material layer.

The upper electrode may include a first upper electrode, a second upper electrode, a third upper electrode, and a fourth upper electrode. The first upper electrode and the second upper electrode may be formed of a first conductive material, and the third upper electrode and the fourth upper electrode may be formed of a second conductive material.

The first conductive material and the second conductive material may be different conductive materials.

The photosensor may further include an insulating layer formed under the upper electrode and that separates the upper electrode from the semiconductor layer and the lower electrode.

The 2-dimensional material layer may be formed of graphene or a metal chalcogenide-based material.

According to an aspect of another exemplary embodiment, there is provided a method of operating a photosensor including a lower electrode, a semiconductor layer formed on the lower electrode, a 2-dimensional material layer formed on the semiconductor layer, and an upper electrode that contacts the 2-dimensional material layer, including detecting light radiated to the 2-dimensional material layer, in a multiple detection mode.

The multiple detection mode may include a lateral detection mode and a vertical detection mode.

The lateral detection mode and the vertical detection mode may be alternately executed.

The upper electrode may include a plurality of electrode elements, and the lateral detection mode may include measuring photocurrent generated due to light radiated to the 2-dimensional material layer, using the electrode elements of the upper electrode.

The upper electrode may include a first upper electrode and a second upper electrode, each of which is in contact with the 2-dimensional material layer. The photocurrent generated due to the light radiated to the 2-dimensional material layer may be measured using the first upper electrode and the second upper electrode.

The vertical detection mode may include measuring a photocurrent generated due to light radiated to the 2-dimensional material layer using the upper electrode and the lower electrode.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
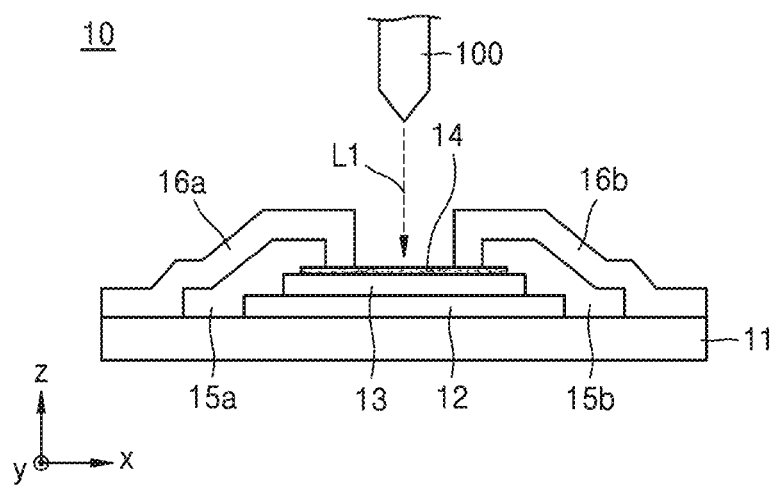
FIG. 1 is a cross-sectional view of a photosensor according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects.

A photosensor according to an exemplary embodiment will now be described more fully with reference to the accompanying drawings, in which exemplary embodiments are shown. In the drawings, the widths and thicknesses of layers and regions are exaggerated for clarity. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof, unless the context clearly indicates otherwise.

FIG. 1 is a cross-sectional view of a photosensor 10 according to an exemplary embodiment.

Referring to FIG. 1, the photosensor 10 according to the exemplary embodiment may include a lower electrode 12 formed on a substrate 11, a semiconductor layer 13 formed on the lower electrode 12, and a 2-dimensional material layer 14 formed on the semiconductor layer 13. An insulating layer, for example, first and second insulating layers 15a and 15b, may be formed on both side portions of the 2-dimensional material layer 14. For example, the first insulating layer 15a may be formed on a first side portion of the 2-dimensional material layer 14, and the second insulating layer 15b may be formed on a second side portion of the 2-dimensional material layer 14. The first and second insulating layers 15a and 15b may extend from the substrate 11 to the side portions of the 2-dimensional material layer 14.

FIG. 1 shows an example in which the 2-dimensional material layer 14 has a smaller width than the semiconductor layer 13 disposed thereunder, and the semiconductor layer 13 has a smaller width than the lower electrode 12 disposed thereunder. However, the present disclosure is not limited thereto. The first insulating layer 15a and the second insulating layer 15b may be respectively formed to cover first and second side portions of the lower electrode 12, the semiconductor layer 13, and the 2-dimensional material layer 14 from both sides of the substrate 11.

In addition, an upper electrode, for example, first and second upper electrodes 16a and 16b, may be formed on the insulating layer, namely, the first and second insulating layers 15a and 15b, and in contact with a surface of the 2-dimensional material layer 14. The upper electrode may include at least two electrode elements, that is, the first upper electrode 16a and the second upper electrode 16b. The first upper electrode 16a may be formed on first insulating layer 15a and in contact with the 2-dimensional material layer 14 in a first region. The second upper electrode 16b may be formed on the second insulating layer 15b and in contact with the 2-dimensional material layer 14 in a second region. The first and second regions in which the first upper electrode 16a and the second upper electrode 16b are in contact with the surface of the 2-dimensional material layer 14 may be different regions. The first upper electrode 16a and the second upper electrode 16b may be formed apart from each other on the 2-dimensional material layer 14. The first region in which the first upper electrode 16a is in contact with the 2-dimensional material layer 14 may be separated from the second region in which the second upper electrode 16b is in contact with the 2-dimensional material layer 14.

The substrate 11 may be formed of a material used for a substrate of an electronic substrate. The substrate 11 may be, for example, a silicon (Si) substrate, a glass substrate, or an insulating polymer substrate.

The first and second insulating layers 15a and 15b may be formed of a material having a low electrical conductivity. The first and second insulating layers 15a and 15b may be formed of a material used for an interlayer dielectric (ILD) of a typical electronic device. For example, the first and second insulating layers 15a and 15b may include silicon oxide ($SiO_2$) or a material having a higher dielectric constant (i.e., a high-k material) higher than the dielectric constant of silicon oxide. The first and second insulating layers 15a and 15b may be formed of silicon nitride, hafnium oxide, aluminum oxide, tungsten oxide, tantalum oxide, titanium oxide, or ruthenium oxide. Also, the first and second insulating layers 15a and 15b may be formed of an insulating polymer. The first and second insulating layers 15a and 15b may be formed between the first and second upper electrodes 16a and 16b and the semiconductor layer 13 and the lower electrode 12 and separate the first and second upper electrodes 16a and 16b from the semiconductor layer 13 and the lower electrode 12.

The lower electrode 12 and the first and second upper electrodes 16a and 16b may be formed of a conductive material and include a metal, a conductive metal oxide, or a conductive metal nitride. For example, the lower electrode 12 and the first and second upper electrodes 16a and 16b may be formed of, for example, a metal such as nickel (Ni), copper (Cu), silver (Ag), gold (Au), aluminum (Al), platinum (Pt), titanium (Ti), tungsten (W), ruthenium (Ru), or tantalum (Ta), an alloy, or a conductive polymer. The upper electrode may include at least two electrode elements, for example, the first and second upper electrodes 16a and 16b, each of which may be in contact with the 2-dimensional material layer 14. Also, the first and second upper electrodes 16a and 16b may be formed of the same conductive material or different conductive materials. Responsivity of the first and second upper electrodes 16a and 16b may vary according to the types of materials forming the first and second upper electrode 16a and 16b and the wavelength of light incident to the 2-dimensional material layer 14. Also, responsivity between the first upper electrodes 16a and second upper electrodes 16b and responsivity between the lower electrode 12 and the first and second upper electrodes 16a and 16b may vary according to the types of materials forming the lower electrode 12 and the first and second upper electrode 16a and 16b.

The semiconductor layer 13 may be formed of various semiconductor materials and include a compound semiconductor or an oxide semiconductor. For example, the semiconductor layer 13 may include a zinc (Zn) oxide semiconductor, an indium (In) oxide semiconductor, or a gallium (Ga) oxide semiconductor. Also, the semiconductor layer 13 may be formed of a semiconductor material containing zinc (Zn), gallium (Ga), indium (In), arsenide (As), phosphorus (P), or a chalcogenide material. Specifically, the semiconductor layer 13 may be formed of In—Ga—Zn oxide (IGZO). The semiconductor layer 13 may be formed along with the 2-dimensional material layer 14 as a channel layer of the photosensor according to the exemplary embodiment.

The 2-dimensional material layer 14 may include a 2-dimensional material having a conductivity. The 2-dimensional material layer 14 may have a single-layered or half-layered structure in which atoms have a predetermined crystal structure. However, the present disclosure is not limited thereto, and the 2-dimensional material layer 14 may have a structure including a plurality of atomic layers.

A 2-dimensional material may contain a carbon-containing material, such as graphene, or a metal chalcogenide-based material. Graphene may be a single-layered structure in which carbon atoms are combined, and the 2-dimensional material layer 14 may include one graphene layer or a plurality of graphene layers. Also, the metal chalcogenide-based material may be a transition metal dichalcogenide (TMDC) material containing a transition metal and a chalcogen material. A transition metal may be at least one of molybdenum (Mo), tungsten (W), niobium (Nb), vanadium (V), tantalum (Ta), titanium (Ti), zirconium (Zr), hafnium (Hf), technetium (Tc), and rhenium (Re), and the chalcogenide material may be at least one of sulfur (S), selenium (Se), and tellurium (Te). Also, the 2-dimensional material layer 14 may be formed of a metal chalcogenide material containing a non-transition metal, and the non-transition metal may be, for example, gallium (Ga), indium (In), tin (Sn), germanium (Ge), or lead (Pb). As a result, a 2-dimensional material layer 14 may be formed of graphene or a metal chalcogenide-based material. The 2-dimensional material layer 14 may be formed of at least one metal element of Mo, W, Nb, V, Ta, Ti, Zr, Hf, Tc, Re, Cu, Ga, In, Sn, Ge, and Pb and at least one chalcogenide element of S, Se, and Te. Materials that may be included in the respective layers described above may be applied to other components indicated by the same names.

As shown in FIG. 1, in the photosensor according to the exemplary embodiment, when light L1 emitted from an external light source 100 is radiated to the 2-dimensional material layer 14, photocurrent may be generated. The generated photocurrent may be measured using the lower electrode 12 or the first and second upper electrodes 16a and 16b. The photosensor according to the exemplary embodiment may detect the light L1 radiated by the external light source 100, in a multiple detection mode, as described with reference to FIG. 2.

Figure 2:
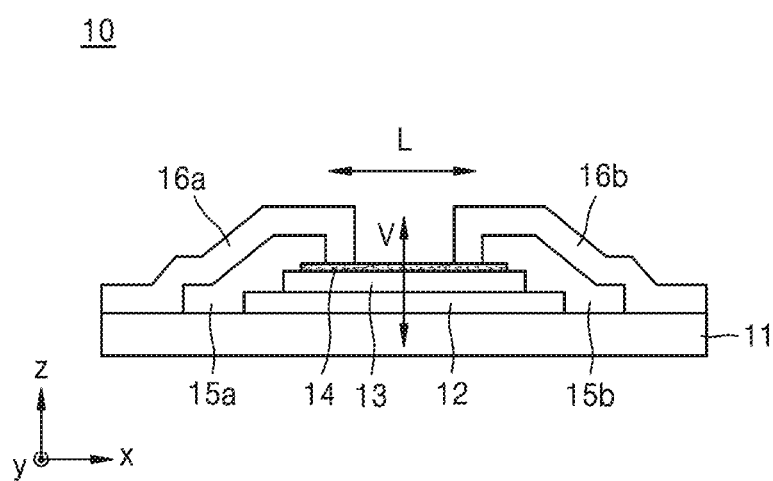
FIG. 2 is a cross-sectional view of the photosensor showing a lateral detection mode and a vertical detection mode of the photosensor according to an exemplary embodiment.

FIG. 2 is a cross-sectional view of a lateral detection mode and a vertical detection mode of the photosensor 10 according to an exemplary embodiment.

Referring to FIGS. 1 and 2, the photosensor 10 according to the exemplary embodiment may detect the light L1 radiated by the external light source 100 in a multiple detection mode. The multiple detection mode may include a lateral detection mode (L-direction) and a vertical detection mode (V-direction).

The lateral detection mode may be based on the principle of the photo-thermoelectric effect. When the light L1 emitted by the external light source 100 is radiated to the 2-dimensional material layer 14, electrons and holes of the 2-dimensional material layer 14 may absorb the light L1, may diffuse in the direction L of FIG. 2 due to heat, and may move toward the first and second upper electrodes 16a and 16b that are in contact with the 2-dimensional material layer 14. The electrons and the holes may be respectively detected by the first upper electrode 16a and the second upper electrode 16b. In the lateral detection mode, when the light L1 is radiated near the first upper electrode 16a and the second upper electrode 16b, responsivity may be high.

In the vertical detection mode, charges of the semiconductor layer 13 may be excited due to the light L1 that is emitted by the external light source 100 and radiated to the 2-dimensional material layer 14 so that hot carriers may be formed and photocurrent corresponding to kinetic energy excited by the incident light L1 may be generated. The generated photocurrent may be measured using the lower electrode 12 and the first and second upper electrodes 16a and 16b.

The photosensor 10 according to the exemplary embodiment may include the semiconductor layer 13 and the 2-dimensional material layer 14 interposed between the lower electrode 12 and the first and second upper electrodes 16a and 16b, and may operate in a multiple detection mode including the lateral detection mode and the vertical detection mode. According to an exemplary embodiment of a specific detection method, the lateral detection mode and the vertical detection mode may be alternately performed. When the lateral detection mode and the vertical detection mode are alternately performed, a duty cycle may be optionally controlled.

Figure 3:
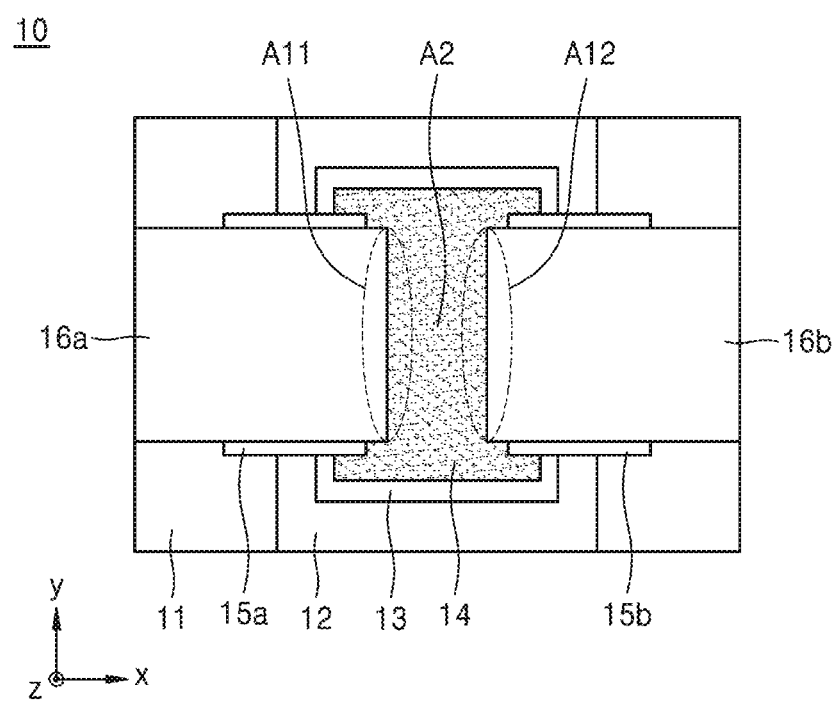
FIG. 3 is a plan view of a photosensor according to an exemplary embodiment.

FIG. 3 is a plan view of a photosensor 10 according to an exemplary embodiment.

Referring to FIG. 3, when a lateral detection mode is used during an operation of the photosensor 10 according to the exemplary embodiment, the responsivity to light radiated to regions A11 and A12 may be higher than the responsivity to light radiated to other portions of the 2-dimensional material layer 14. The region A11 may be a region disposed adjacent to a portion in which the first upper electrode 16a is in contact with the 2-dimensional material layer 14, and the region A12 may be a region disposed adjacent to a portion in which the second upper electrode 16b is in contact with the 2-dimensional material layer 14. A region A2 corresponding to the 2-dimensional material layer 14 between the first upper electrode 16a and the second upper electrode 16b may be a surface region of the 2-dimensional material layer 14, which may be relatively separate from the first upper electrode 16a and the second upper electrode 16b. As compared with the regions A11 and A12, the region A2 may have a low responsivity to light radiated in the lateral detection mode. Accordingly, a photo-detection operation may be performed on the region A2 according to the vertical detection mode. As a result, the photosensor according to the exemplary embodiment may perform the photo-detection operation on the region A2 of the surface region of the 2-dimensional material layer 14 to which the light L1 emitted by the external light source 100 is radiated, according to the vertical detection mode. Also, the photosensor 10 according to the exemplary embodiment may perform a photo-detection operation on the region A11, which is adjacent to the portion in which the 2-dimensional material layer 14 is in contact with the first upper electrode 16a, and the region A12, which is adjacent to the portion in which the 2-dimensional material layer 14 is in contact with the second upper electrode 16b, according to the lateral detection mode. As a result, the photosensor 10 according to the exemplary embodiment may have a multiple detection mode in which the lateral detection mode and the vertical detection mode are performed at the same time.

A photosensor according to an exemplary embodiment may not only improve responsivity to light radiated from an external light source, but also determine the wavelength of incident light by using a multiple detection mode. A wavelength range having a relatively high responsivity may be determined according to the type of the first and second upper electrodes 16a and 16b in a lateral detection mode. For example, when an Au electrode is used as the first and second upper electrodes 16a and 16b, the responsivity to light may be relatively higher, for example in a wavelength range of about 450 nm to about 500 nm, than in the other wavelength range. Also, in a vertical detection mode, since photocurrent corresponding to kinetic energy that may be obtained according to the wavelength of light radiated to the 2-dimensional material layer 14 may be measured, the wavelength of the light may be determined based on photocurrent. As a result, in the lateral detection mode and the vertical detection mode, photo-detection results may vary according to the wavelength of light incident to the 2-dimensional material layer 14. Also, precise information regarding the wavelength of the light incident to the 2-dimensional material layer 14 may be obtained using measured photocurrent according to the lateral detection mode and the vertical detection mode.

Figure 4A:
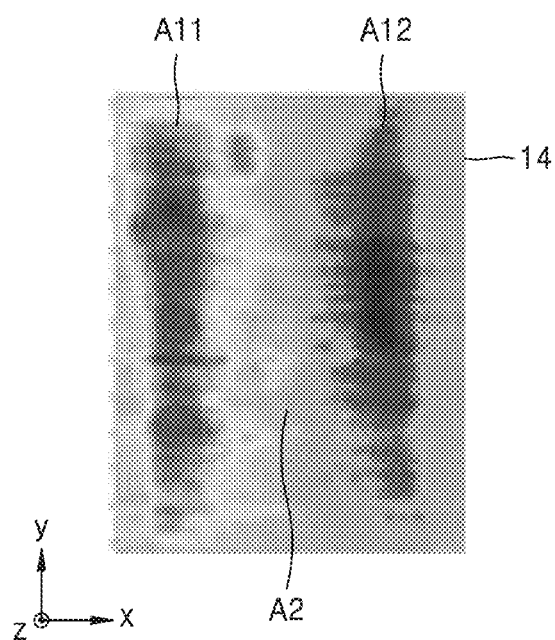
FIG. 4A is a diagram of a photocurrent map due to a lateral detection mode in a photosensor according to an exemplary embodiment.
Figure 4B:
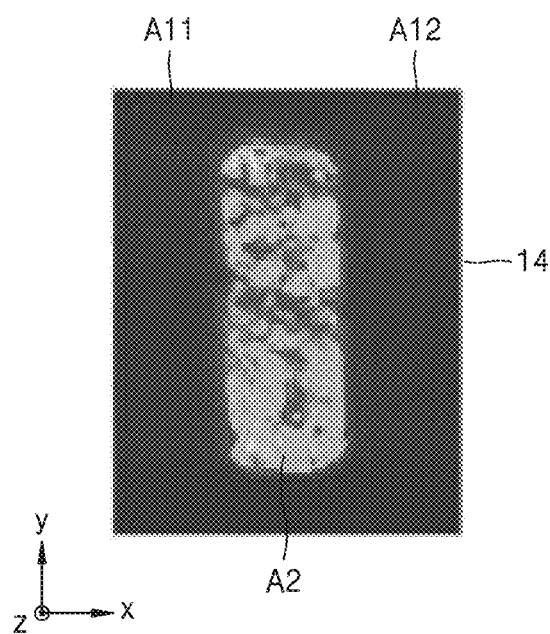
FIG. 4B is a diagram of a photocurrent map due to a vertical detection mode in a photosensor according to an exemplary embodiment.

FIG. 4A is a diagram of a photocurrent map providing results of a lateral detection mode in a photosensor according to an exemplary embodiment, and FIG. 4B is a diagram of a photocurrent map providing results of a vertical detection mode in a photosensor according to an exemplary embodiment.

The photosensor configured to measure photocurrent characteristics shown in FIGS. 4A and 4B includes a substrate 11 formed of glass, a lower electrode 12 formed of nickel (Ni) (hereinafter, referred to as the Ni lower electrode 12) to a thickness of about 45 nm, a semiconductor layer 13 formed of IGZO on the Ni lower electrode 12, and a 2-dimensional material layer 14 formed of graphene (hereinafter, referred to as the graphene 2-dimensional material layer 14) on the semiconductor layer 13. Also, first and second insulating layers 15a and 15b were formed of $SiO_2$, and the first and second upper electrodes 16a and 16b were formed of Au. In the above-described photosensor, light was radiated to the 2-dimensional material layer 14 formed of graphene.

Referring to FIG. 4A, photocurrent values were measured in a region A11, which is adjacent to a portion in which the graphene 2-dimensional material layer 14 is in contact with the first upper electrode 16a, and a region A12, which is adjacent to a portion in which the graphene 2-dimensional material layer 14 is in contact with the second upper electrode 16b. In this case, light having various wavelengths was radiated to the 2-dimensional material layer 14, and FIG. 4A shows measurements of photocurrent obtained when light having a wavelength of about 481 nm was radiated. In FIG. 4A, the regions A11 and A12 had different colors or patterns than the region A2. Specifically, a current of about 1.5 nA or more was detected in the region A11, and a current of −1.5 nA or less was detected in the region A12. In contrast, a current larger than −1 nA and smaller than 1 nA was detected in the region A2. The regions A11 and A12 may be peripheral regions of regions in which the graphene 2-dimensional material layer 14 is in contact with the first upper electrode 16a and the second upper electrode 16b, and clearly differ from the other portions. It may be determined that the responsivity of the regions A11 and A12 were different from the other portions in the lateral detection mode. Through the result of measured photocurrents, it may be confirmed that a central region of the graphene 2-dimensional material layer 14 (i.e., the region A2 between the first upper electrode 16a and the second upper electrode 16b) had a lower responsivity than the regions A11 and A12.

Referring to FIG. 4B, photocurrent between the Ni lower electrode 12 and the first and second upper electrodes 16a and 16b was measured in the vertical detection mode. FIG. 4B shows results obtained by radiating light having a wavelength of about 403 nm to the graphene 2-dimensional material layer 14. In FIG. 4B, the region A2 had colors or patterns clearly distinguished from the remaining region of the 2-dimensional material layer 14. The region A2 may correspond to the central region of the graphene 2-dimensional material layer 14 (i.e., the region between the first upper electrode 16a and the second upper electrode 16b), and it may be confirmed that photocurrent values were measured from the region A2.

Figure 5:
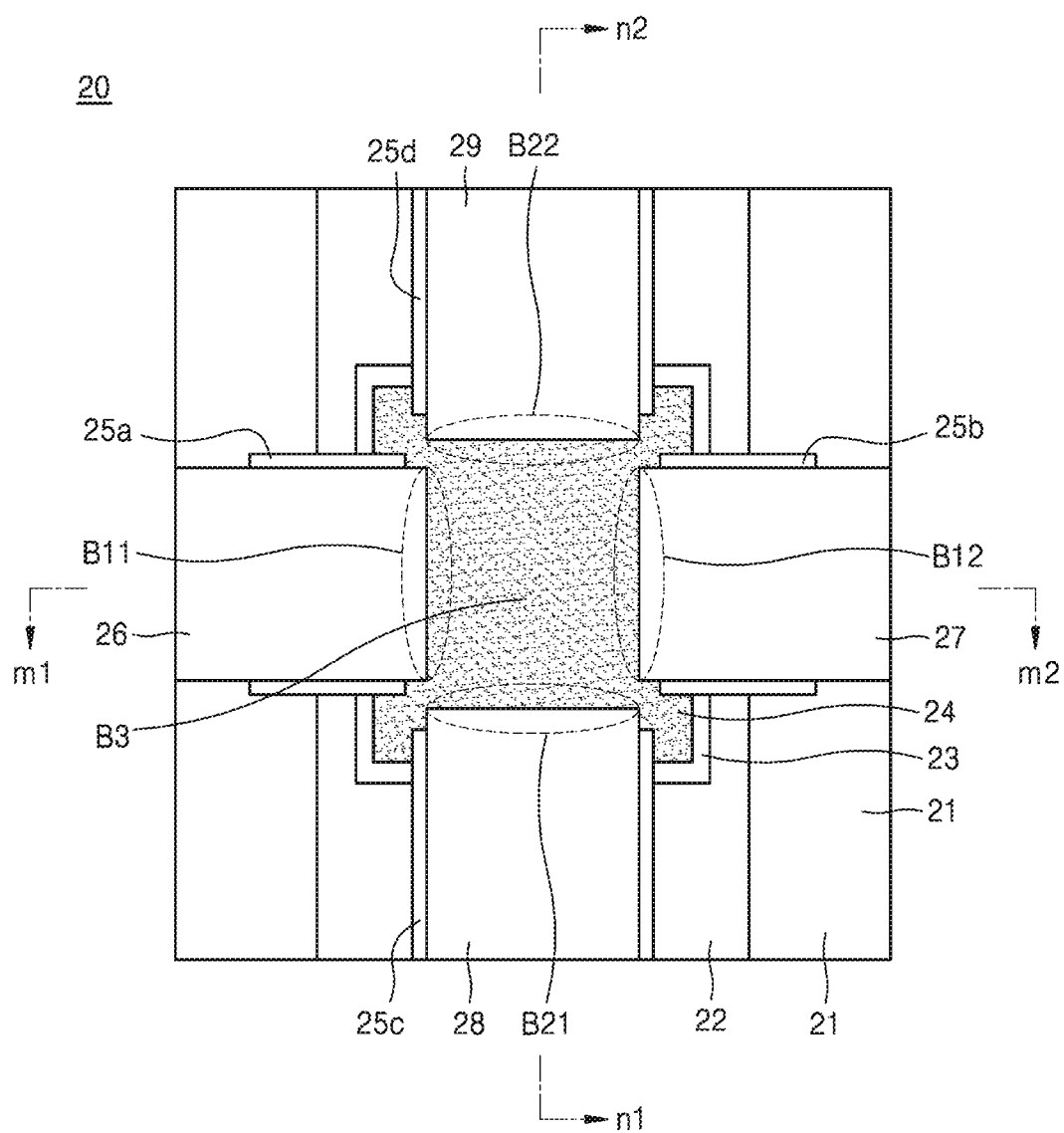
FIG. 5 is a plan view of a photosensor according to another exemplary embodiment.
Figure 6A:
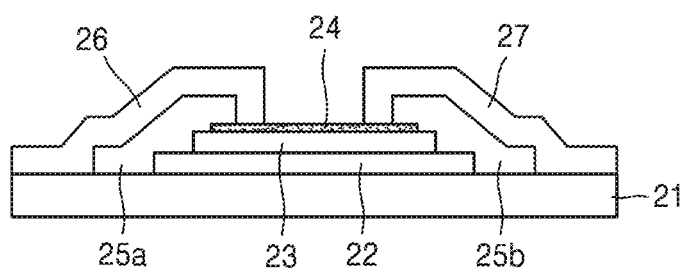
FIG. 6A is a cross-sectional view taken along line m1-m2 of FIG. 5.

FIG. 5 is a plan view of a photosensor 20 according to another exemplary embodiment. FIG. 6A is a cross-sectional view taken along line m1-m2 of FIG. 5, and FIG. 6B is a cross-sectional view taken along line n1-n2 of FIG. 5.

Figure 6B:
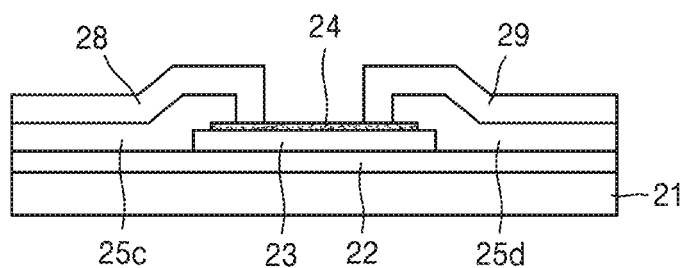
FIG. 6B is a cross-sectional view taken along line n1-n2 of FIG. 5.

Referring to FIGS. 5, 6A, and 6B, the photosensor 20 may include a lower electrode 22 formed on a substrate 21, a semiconductor layer 23 formed on the lower electrode 22, and a 2-dimensional material layer 24 formed on the semiconductor layer 23. The 2-dimensional material layer 24 may be formed to be in contact with each of a first upper electrode 26, a second upper electrode 27, a third upper electrode 28, and a fourth upper electrode 29. Insulating layers 25a, 25b, 25c, and 25d may be formed between the first to fourth upper electrodes 26, 27, 28, and 29 and the lower electrode 22 and the semiconductor layer 23, respectively. Regions in which the first upper electrode 26, the second upper electrode 27, the third upper electrode 28, and the fourth upper electrode 29 are in contact with the 2-dimensional material layer 24 may be different regions that are separate from one another. The first to fourth upper electrodes 26, 27, 28, and 29 may be formed of the same conductive material or different conductive materials. Also, the first upper electrode 26 and the second upper electrode 27 may be formed of a first conductive material, and the third upper electrode 28 and the fourth upper electrode 29 may be formed of a second conductive material. The first conductive material and the second conductive material may be different conductive materials.

By forming a plurality of electrode elements of an upper electrode (i.e., the first through fourth upper electrodes 26, 27, 28, and 29) on the 2-dimensional material layer 24, incident light having various wavelengths may be detected. Since responsivity to the wavelength of light incident in the lateral detection mode varies according to materials forming the first to fourth upper electrodes 26, 27, 28, and 29, light having various wavelengths may be detected by one photosensor 20. Photocurrents of light may be measured according to a lateral detection mode in regions B11, B12, B21, and B22, which are peripheral regions of regions in which the first to fourth upper electrodes 26, 27, 28, and 29 are in contact with the 2-dimensional material layer 24. Also, photocurrent of light may be measured according to a vertical detection mode in a region B3 of the 2-dimensional material layer 24 among the first through fourth upper electrodes 26, 27, 28, and 29. Although FIG. 5 illustrates an example in which the 2-dimensional material layer 24 has a tetragonal surface shape, the present disclosure is not limited thereto. For example, a surface of the 2-dimensional material layer 24 may have various and unlimited shapes, such as a circular shape, an elliptical shape, a polygonal shape, or a shape with irregular curvature. Furthermore, although FIG. 5 illustrates an example in which the first to fourth upper electrodes 26, 27, 28, and 29 are four electrode elements formed separately, the present disclosure is not limited thereto. In other cases, the first to fourth upper electrodes 26, 27, 28, and 29 may include a larger number of electrodes that are formed separately.

As described above, the photosensor according to the exemplary embodiments may have a multiple detection mode, may improve responsivity to incident light by using a lateral detection mode and a vertical detection mode, and may detect information regarding the incident light more precisely. Furthermore, externally radiated light may be converted into current using a multiple detection mode in the entire channel region, thereby enhancing energy efficiency of the entire channel region. However, the photosensor is not limited to these exemplary objects.

The photosensor may include a photo detector or a photodiode (PD) and be used along with another electronic device and applied to an energy harvesting technique.

Exemplary embodiments may provide a photosensor having a multiple detection mode.

A photosensor according to an exemplary embodiment may include a semiconductor layer and a 2-dimensional material layer. Information regarding externally radiated light, which includes the wavelength of the light, may be detected using a multiple detection mode including a lateral detection mode and a vertical detection mode.

An upper electrode that is in contact with a 2-dimensional material layer may include a plurality of electrode elements. The respective electrode elements may be formed of the same conductive material or different conductive materials. Information (i.e., light wavelength) regarding light radiated by an external light source to the 2-dimensional material layer may be obtained using the multiple detection mode including the lateral detection mode and the vertical detection mode, thereby enabling a more precise detection of the information regarding the light.

Furthermore, information regarding light radiated by an external light source to a 2-dimensional material layer may be obtained not only from a region in which the 2-dimensional material layer is in contact with an upper electrode, but also from a central region of the 2-dimensional material layer between electrode elements of the upper electrode. Thus, photo-detection efficiency may be enhanced.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims. For example, the number of electrode elements of an upper electrode formed on a 2-dimensional material layer and positions of contact between the electrode elements and the 2-dimensional material layer may be optionally determined in various manners.

What is claimed is:

1. A photosensor for light detection, comprising:
   a lower electrode;
   a semiconductor layer formed on the lower electrode;
   a 2-dimensional material layer formed on the semiconductor layer, the 2-dimensional material layer having one continuous layer of a 2-dimensional material; and
   an upper electrode that contacts the 2-dimensional material layer, the upper electrode including at least two electrode elements, each of the electrode elements being in contact with the one continuous layer of the 2-dimensional material, the electrode elements being spaced apart from one another in a lateral direction on the one continuous layer.

2. The photosensor of claim 1, wherein the upper electrode includes a first upper electrode and a second upper electrode, each of which is in contact with the 2-dimensional material layer.

3. The photosensor of claim 1, wherein the upper electrode includes a first upper electrode, a second upper electrode, a third upper electrode, and a fourth upper electrode,
   wherein the first upper electrode and the second upper electrode are formed of a first conductive material, and
   the third upper electrode and the fourth upper electrode are formed of a second conductive material.

4. The photosensor of claim 3, wherein the first conductive material and the second conductive material are different conductive materials.

5. The photosensor of claim 3, wherein the first upper electrode and the second upper electrode are spaced apart from each other in a first direction, and
   wherein the third upper electrode and the fourth upper electrode are spaced apart from each other in a second direction which is perpendicular to the first direction.

6. The photosensor of claim 1, further comprising an insulating layer formed under the upper electrode and that separates the upper electrode from the semiconductor layer and the lower electrode.

7. The photosensor of claim 1, wherein the 2-dimensional material layer is formed of graphene or a metal chalcogenide-based material.

8. The photosensor of claim 1, wherein the semiconductor layer is configured to generate photocurrent due to the light incident on the photosensor.

9. The photosensor of claim 1, wherein the semiconductor layer includes an oxide semiconductor.

10. The photosensor of claim 9, wherein the oxide semiconductor includes at least one of a zinc (Zn) oxide semiconductor, an indium (In) oxide semiconductor, and a gallium (Ga) oxide semiconductor.

11. The photosensor of claim 1, wherein the photosensor is configured to detect light in both of a lateral detection mode and a vertical detection mode, and
    wherein the photosensor is configured to detect charges by using the at least two electrode elements of the upper electrode in the lateral detection mode, and configured to detect photocurrent by using the lower electrode and the upper electrode in the vertical detection mode.

* * * * *